(12) United States Patent
Zhao et al.

(10) Patent No.: US 12,340,863 B2
(45) Date of Patent: Jun. 24, 2025

(54) STACKED MEMORY CHIP SOLUTION WITH REDUCED PACKAGE INPUTS/OUTPUTS (I/OS)

(71) Applicant: Intel Corporation, Santa Clara, CA (US)

(72) Inventors: Chong J. Zhao, West Linn, OR (US); Shigeki Tomishima, Portland, OR (US); Kuljit S. Bains, Olympia, WA (US); James A. McCall, Portland, OR (US); Dimitrios Ziakas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 17/372,298

(22) Filed: Jul. 9, 2021

(65) Prior Publication Data

US 2021/0335393 A1     Oct. 28, 2021

(51) Int. Cl.
*G11C 16/04*    (2006.01)
*G11C 5/06*    (2006.01)

(52) U.S. Cl.
CPC .................................. *G11C 5/066* (2013.01)

(58) Field of Classification Search
CPC ...................................................... G11C 5/066
See application file for complete search history.

(56) References Cited

U.S. PATENT DOCUMENTS

| 8,397,013 | B1  | 3/2013  | Rosenband et al. |
| 8,984,189 | B2  | 3/2015  | Casper et al. |
| 9,432,298 | B1* | 8/2016  | Smith ................. H04L 49/9057 |
| 10,740,177 | B2* | 8/2020  | Sethuraman .......... G06F 3/0631 |
| 2006/0126369 | A1 | 6/2006 | Raghuram |
| 2018/0102344 | A1 | 4/2018 | Ramachandra et al. |
| 2019/0103148 | A1 | 4/2019 | Hasbun et al. |
| 2019/0205244 | A1* | 7/2019 | Smith ..................... G06F 3/065 |
| 2019/0354301 | A1 | 11/2019 | Rajgopal et al. |
| 2020/0143870 | A1 | 5/2020 | Zhao et al. |
| 2020/0272564 | A1 | 8/2020 | Keeth et al. |
| 2021/0335393 | A1 | 10/2021 | Zhao et al. |

OTHER PUBLICATIONS

International Search Report and Written Opinion for PCT Patent Application No. PCT/US55/21994, Mailed Jul. 6, 2022, 13 pages.
Dutch Search Report for Patent Application No. 2032113, Mailed Mar. 28, 2023, 11 pages.

* cited by examiner

*Primary Examiner* — Pho M Luu
(74) *Attorney, Agent, or Firm* — Compass IP Law PC

(57) ABSTRACT

A stack of memory chips and a logic chip is placed within a same package. Multiple memory chips of the stack of memory chips are divided into fractions, and multiple internal channels within the package that emanate from the logic chip are coupled to respective ones of the fractions. The logic chip has a multiplexer, including a multiplexer to multiplex a single input/output (I/O) channel of the package to the multiple internal channels.

19 Claims, 10 Drawing Sheets

STACKED MEMORY CHIP SOLUTION WITH REDUCED PACKAGE INPUTS/OUTPUTS (I/OS)

FIELD OF INVENTION

The field of invention pertains generally to the computing sciences, and, more specifically, to a stacked memory chip solution with reduced package inputs/outputs (I/Os).

BACKGROUND

With the onset of "big-data" and other high performance computing environments, system designers are seeking ways to integration increasing amounts of memory capacity into the systems they design. A challenge that presents itself with increased memory integration is managing the density of the wiring that is to couple the memory with the logic chip(s) that access it.

FIGURES

A better understanding of the present invention can be obtained from the following detailed description in conjunction with the following drawings, in which:

FIGS. 1a and 1b depicted a traditional stacked memory solution (prior art);

DETAILED DESCRIPTION

Figure 1A:
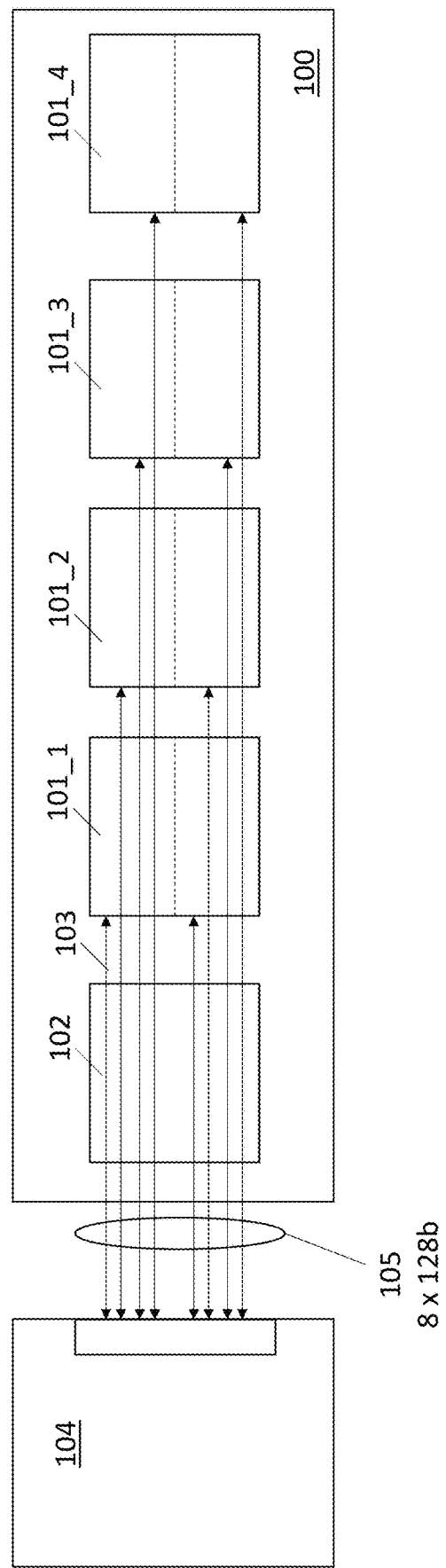

FIG. 1a shows a traditional High Bandwidth Memory (HBM) implementation. As is known in the art, HBM is a stacked memory chip solution whose functional characteristics were initially defined by Joint Electron Engineering Device Engineering Council (JEDEC) engineering specification JESD235 entitled "High Bandwidth Memory (HBM) DRAM" in October, 2013. Subsequent HBM specifications have been published such as HBM2/2E (e.g., JEDEC publications JES235A, JES235B) and future HBM solutions (HBM3) are in development.

As observed in FIG. 1a, a basic implementation includes four memory chips 101_1 through 101_4 stacked on a base logic chip 102. The memory chips and base die are packaged together so that they form a single, packaged memory solution 100.

As observed in FIG. 1a, each memory chip in the package 100 is architecturally divided into two halves and each half has its own dedicated 128b memory channel (for ease of drawing only one 103 of the memory channels is labeled in FIG. 1a). The storage cells of any particular one of the memory chip halves are accessed through the half's dedicated memory channel. As such, there are eight 128b different memory channels within the packaged solution ((4 memory chips)×(2 halves per memory chip)×(1 channel per half)=8 channels). The eight channels are routed directly to the package's input/output (I/Os).

It is worthwhile to point out that FIG. 1a is a high level, logical and/or architectural view. In practice, for example, the base chip 102 may perform additional parallelization along each channel which is then de-parallelized before external transmission. For ease of illustration, FIG. 1a does not depict this level of detail. Additionally, the channels depicted in FIG. 1a only support communication through their respective endpoints (channels progressing completely through one or more chips as observed in FIG. 1a do not accept/receive data from/to such chips).

As such, the package has 1,024 I/Os for the eight channels and a host chip 104 connects to the package's eight channels via 1,024 corresponding wires 105 (1,024 I/Os of the host chip's package are consumed to connect to the memory package's eight channels). In operation, the host is able to communicate with any half of any memory chip within the package whenever it wishes (the eight memory channels are independent of one another).

Figure 1B:
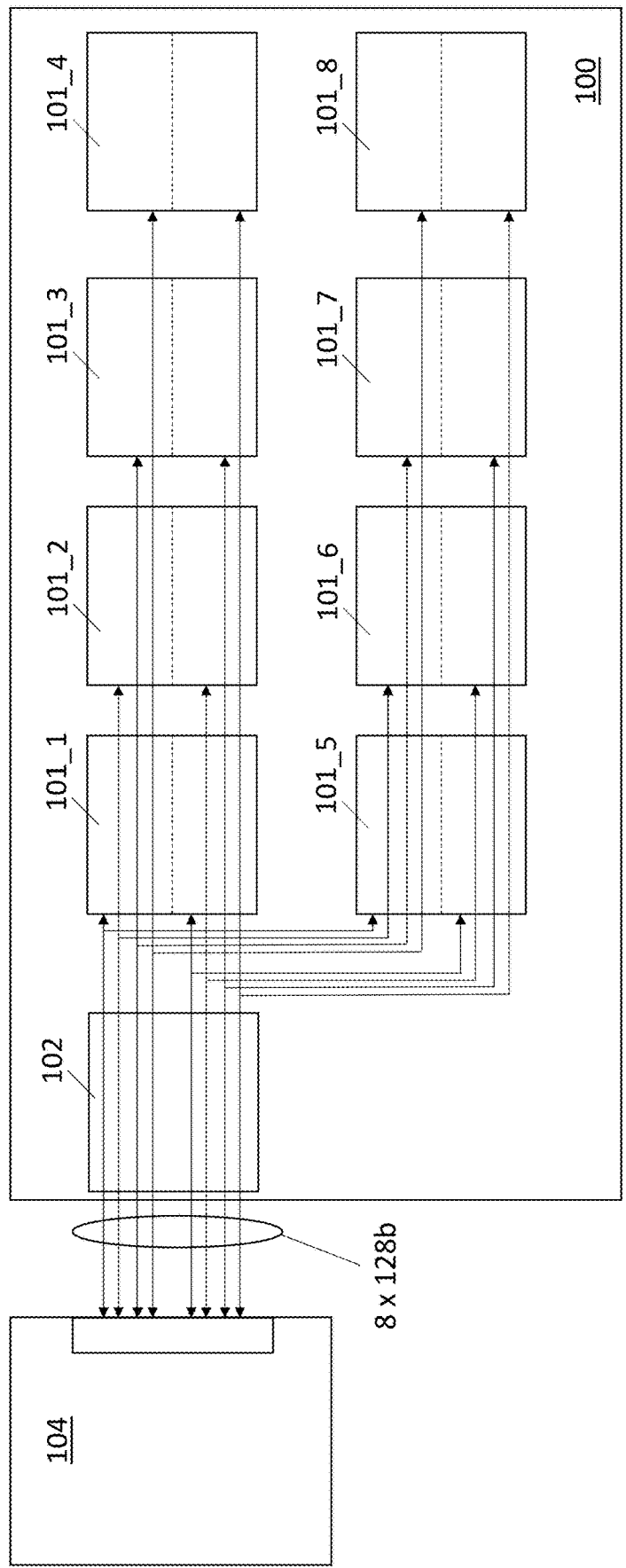

FIG. 1b depicts a further implementation having eight memory chips 101_1 through 101_8 in the package 100. Here, each of the eight memory channels is routed to its own pair of memory chip halves. That is, the doubling of the memory chips in the stack (as compared to the four memory chip stack solution of FIG. 1a) causes each memory channel to double the amount of storage cells it provides access to. The package I/O count for the eight channels remains at 1,024 and the host chip 104 interfaces to the package through the eight memory channels. As compared to the approach of FIG. 1a, an extra address bit is used per channel to determine which memory chip half is being accessed of the two memory chip halves that are connected to the channel.

A problem with the HBM approach of FIGS. 1a and 1b is the high number of I/Os. Specifically, the high number of I/Os requires sophisticated/expensive packaging technologies. With respect to the package 100, smaller pitch balls are required to fit such a large number of I/Os on the bottom surface of the package 100. Additionally, additional complexities may be present such as the use of an embedded multi-die interconnect bridge (EMIB) between the package 100 and the host chip 104.

As is known in the art, because finer pitch wires are more readily formed within a semiconductor chip than within a printed circuit board (PCB), EMIB integrates a silicon chip within the PCB that the memory package 100 and host chip 104 are mounted to. The EMIB silicon chip runs from beneath the memory package I/Os to beneath the host chip package I/Os and includes wiring to effect the correct wiring between the host and memory package (thereby avoiding the use of PCB wires between the host chip 104 and memory package 100).

The finer pitch I/Os on the memory and host chip packages as well as the use of EMIB between them raises the cost of the entire host/memory implementation. Worse yet, the memory capacity of four or eight memory chips is often not enough for many high performance host chips. As such, memory capacity can only be added at the cost of 1,024 additional I/Os on the host chip 104 for every four or eight memory chips to be added.

Figure 2A:
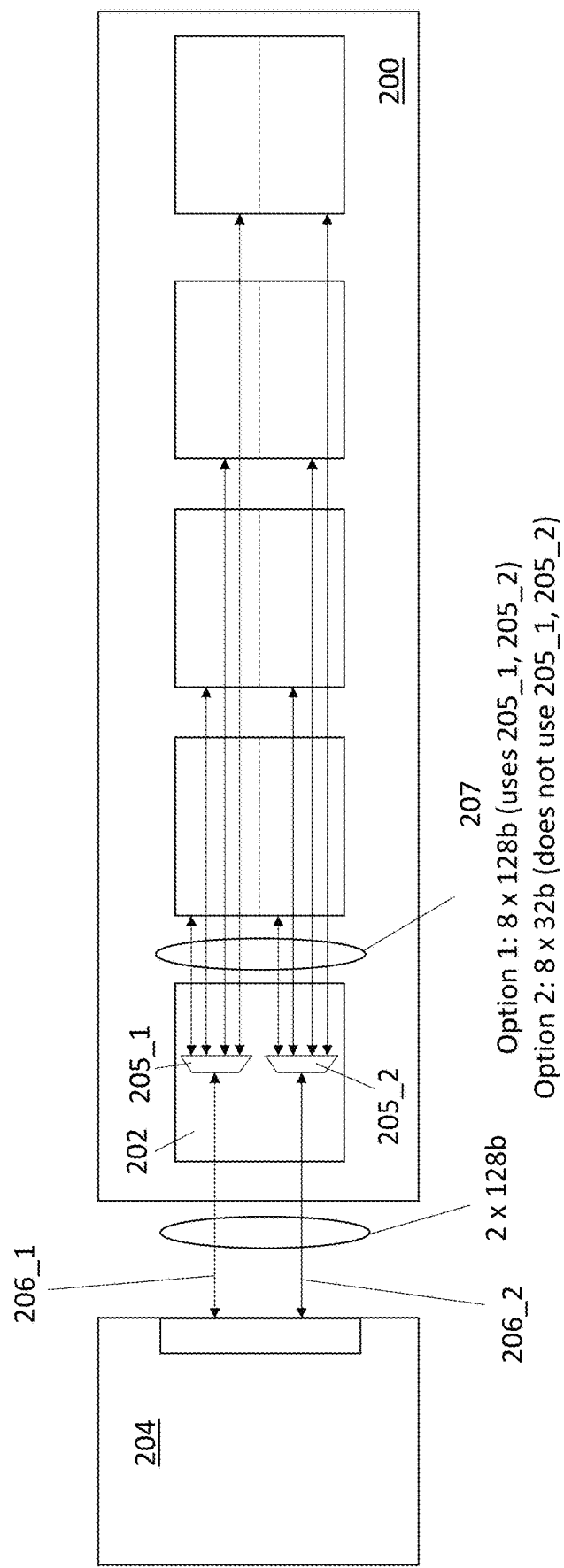
FIGS. 2a and 2b depict an improved stacked memory solution.

An improved approach is observed in FIG. 2a. As observed in FIG. 2a, eight channels remain within the package 200 as per the standard HBM approach. However, rather than feed all eight channels out of the package 200 to the host chip 204, instead, the base logic chip 203 is designed to include a pair of 4:1 multiplexers 205_1, 205_2 (referred to in FIG. 2a as "option 1"). Each multiplexer 205_1, 205_2 has one 128b channel 206_1, 206_2 on its host side and four 128b ("internal") channels on the internal package side. Each of the eight channels 207 within the package 200 is connected to different one of the eight different memory chip halves.

In operation, per host/package channel 206_1, 206_2, two extra address bits are sent by the host chip 204 to identify which of the four memory halves that are accessible through the channel are targeted by any particular access on the channel. In operation, the two extra address bits are applied to the channel select input of the channel's multiplexer 205_1, 205_2 to effectively couple the targeted memory half to the host/package channel 206_1, 206_2.

With this approach, only two 128b channels 206_1, 206_2 (and not eight 128b channels) exist between the memory package 200 and the host chip 204. As such, the wiring between the host chip 204 and the memory package 200 consumes 256b worth of wiring and not 1,024b worth of wiring. This greatly reduces the cost and complexity associated with the I/Os on both the host chip 204 and on the memory package 200 as compared to the standard HBM approach of FIGS. 1a and 1b.

As such, in various implementations, wider pitch I/O balls can be used on either or both of the host chip 204 and memory package 200, and/or, the wiring between the host chip 204 and memory package 200 can be implemented without sophisticated packaging solutions such as EMIB (e.g., the wires between the host and package are formed in the PCB that the host chip and memory package are mounted to).

In another embodiment (referred to as "option 2" in FIG. 2a), the multiplexers 205_1, 205_2 do not exist and, instead, the internal channels 207 are reduced from 128b each to 32b each. In this case, the 128b channel interface 206_1 between the host chip 204 and the package 200 is divided into four independent 32b channels, where, each independent channel connects the host chip 204 to a different memory chip half. A similar arrangement exists for the second 128b channel interface between the host chip 204 and the package 200.

In essence, whereas the option 1 approach multiplexes the external channel according to a 4:1 multiplexing scheme, by contrast, the option 2 approach imposes a 4:1 ratio between the width of the external channel 206_1 (128b) and the width of an internal channel (32b). Notably, the reduction in internal channel width from 128b to 32b could be complemented with a corresponding reduction in page size (e.g., to ¼ of the size used for 128b) to keep page writes/reads to a comparable number of cycles.

Note that the memory bandwidth is the same as between the two options (both options can pass 128b per cycle between the host chip 204 and the package 200). The difference between the two options is that, with the approach of option 1, a parallel transfer of 128b between the host chip 204 and package 200 targets only one memory chip half, whereas, with the approach of option 2, a parallel transfer of 128b between the host chip 204 and the package 200 targets four different memory chip halves.

Figure 2B:
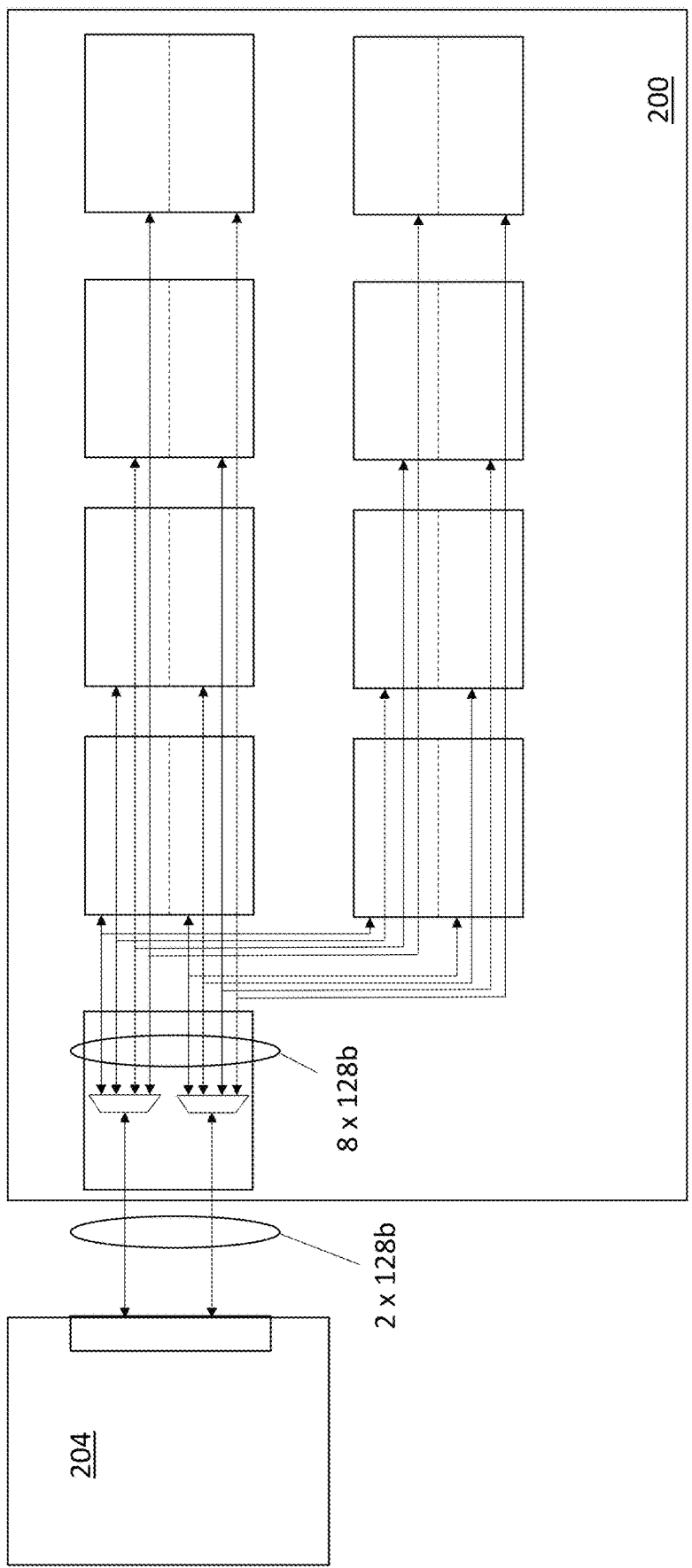

FIG. 2b shows another implementation of the improved approach where eight memory chips are stacked in the same memory package 200. Here, each of the four internal channels that emanate from a particular multiplexer are tied to two memory chip halves and not one memory chip half. As such, in operation, an extra addressing bit is used as compared to the approach of FIG. 2a to identify which of the two memory chip halves that are coupled to the particular internal channel that is selected by the multiplexer is targeted by the access.

Although FIG. 2b suggests an option 1 approach with the presence of the multiplexers in the base chip, an option 2 approach that reduces internal channel width to ¼ of that used in the option 1 approach is also possible. Again, if an option 2 approach is used, the multiplexers are not present. Here, relative to the option 2 approach of FIG. 2a, an extra address bit is used per internal channel to determine which memory chip is being targeted on the internal channel.

The approaches/options of FIGS. 2a and 2b therefore allows for much higher memory capacities with reduced packaging costs for the memory package 200, the host chip 204 and the wiring between them.

That is, assuming each memory chip has a memory capacity of X, the standard HBM solution of FIGS. 1a and 1b consumes 1,024 I/Os on the host chip 204 and the memory package 200 for a memory capacity of 8× (assuming a maximum of eight memory chips per package). By contrast, for a same total number of host and memory package I/Os (1,024), the improved approach of FIGS. 2a and 2b allows for four memory packages, which, in turn, corresponds to a memory capacity of 32× (four packages of eight memory chips each).

Thus, from a cost or packaging complexity perspective, the approach of FIGS. 2a and 2b allows for four times the amount of memory capacity.

Figure 3A:
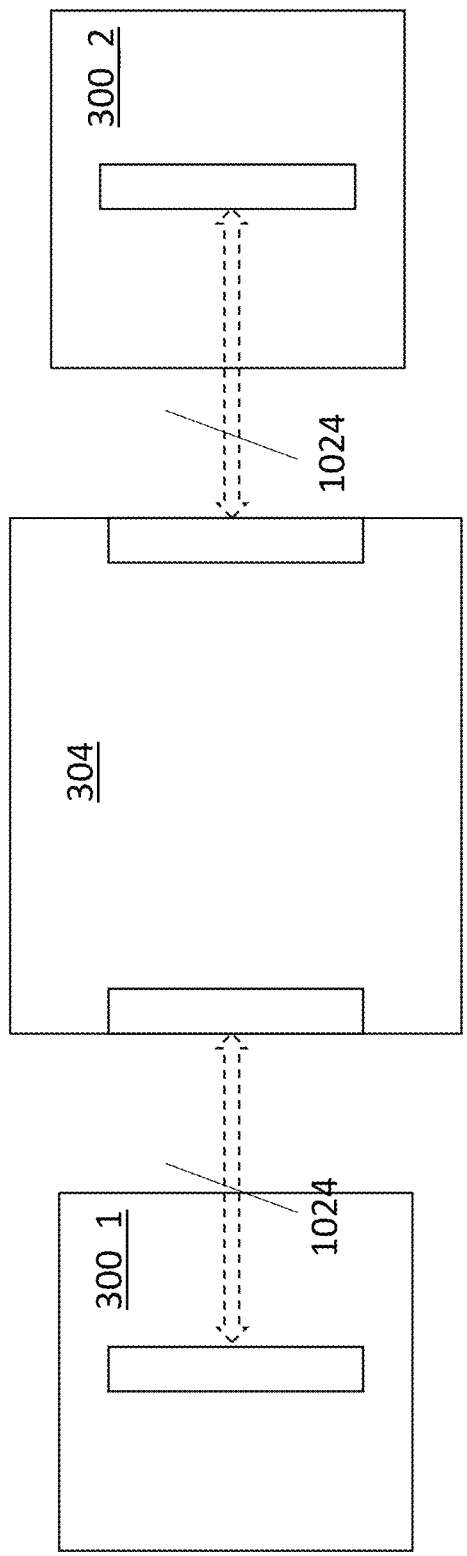
FIG. 3a shows a traditional stacked memory implementation (prior art)
Figure 3B:
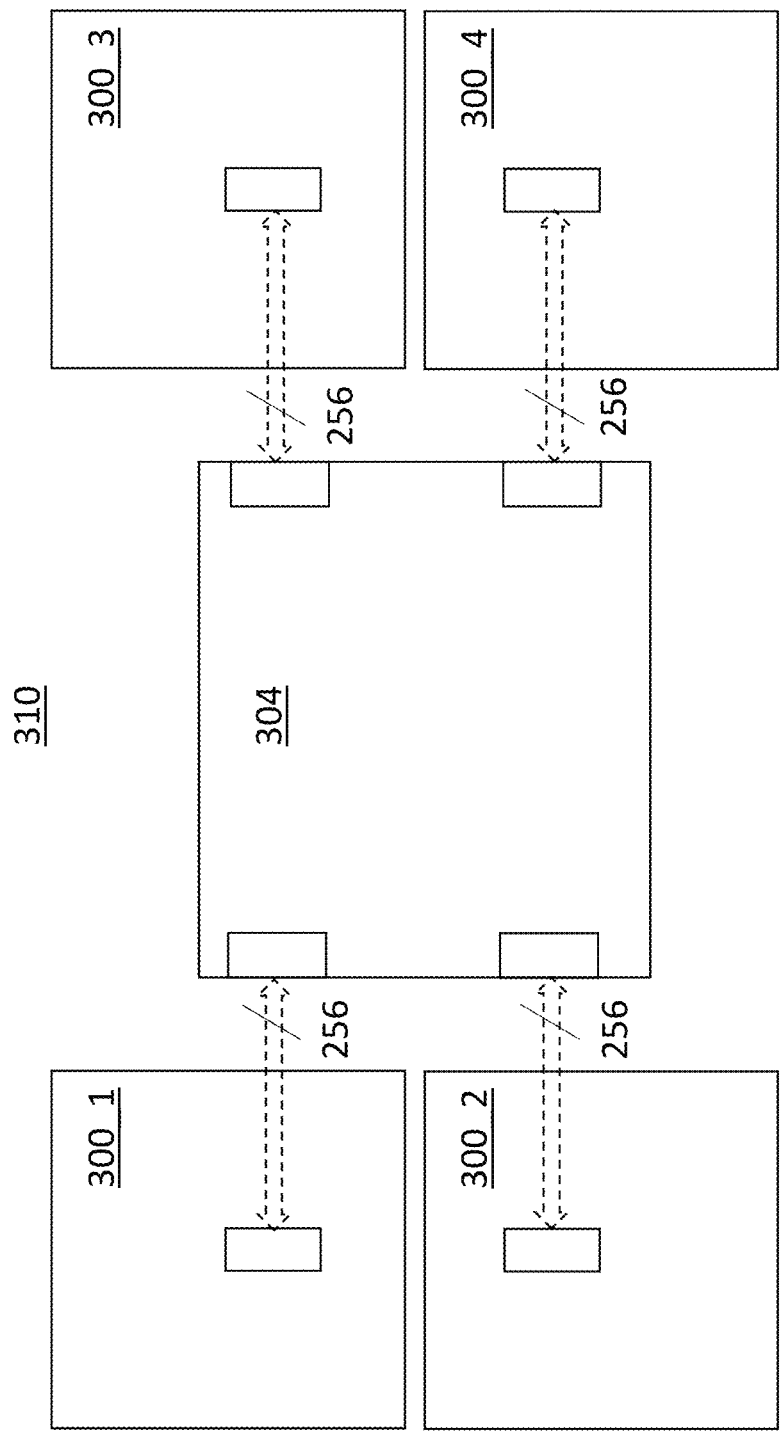
FIG. 3b shows an improved stacked memory solution.

FIGS. 3a and 3b show top-down views of exemplary physical layout implementations of both the standard HBM approach (depicted in FIG. 3a) and the improved approach of the present application (depicted in FIG. 3b). Comparing FIGS. 3a and 3b, note that the improved approach of FIG. 3b has twice the memory capacity of the approach of FIG. 3a (four memory packages 300_1 through 300_4 vs. two memory packages 300_1 and 300_2), while, at the same time, the approach of FIG. 3b consumes half the I/Os on the host chip package 304 and, corresponding, half the number of wires between the host chip 304 and the memory packages (1,024 total in the approach of FIG. 3b and 2,048 total in the approach of FIG. 3a).

In various embodiments, the host side chip 304 is a processor chip such as a processor chip containing multiple general purpose central processing unit (CPU) cores, or, a specialized processor chip such as a graphics processing unit (GPU) chip. Alternatively, the host side chip 304 can be an accelerator chip such as a neural network accelerator chip used for artificial intelligence (AI) chip purposes, etc. In further embodiments the host chip includes both processor and accelerator cores. Regardless, at least non-volatile some of the memory capacity within the stacked memory chip package 300 serves as the memory used by the processor chip, accelerator chip, processing cores, accelerator cores, etc.

In still other embodiments, the host side chip 304 is a buffer chip and the solution 310 observed in FIG. 3b is used as a memory module or memory tile, where, multiple instantiations of the module/tile 310 can be plugged into a larger system to form/expand the larger system's memory.

Figure 4:
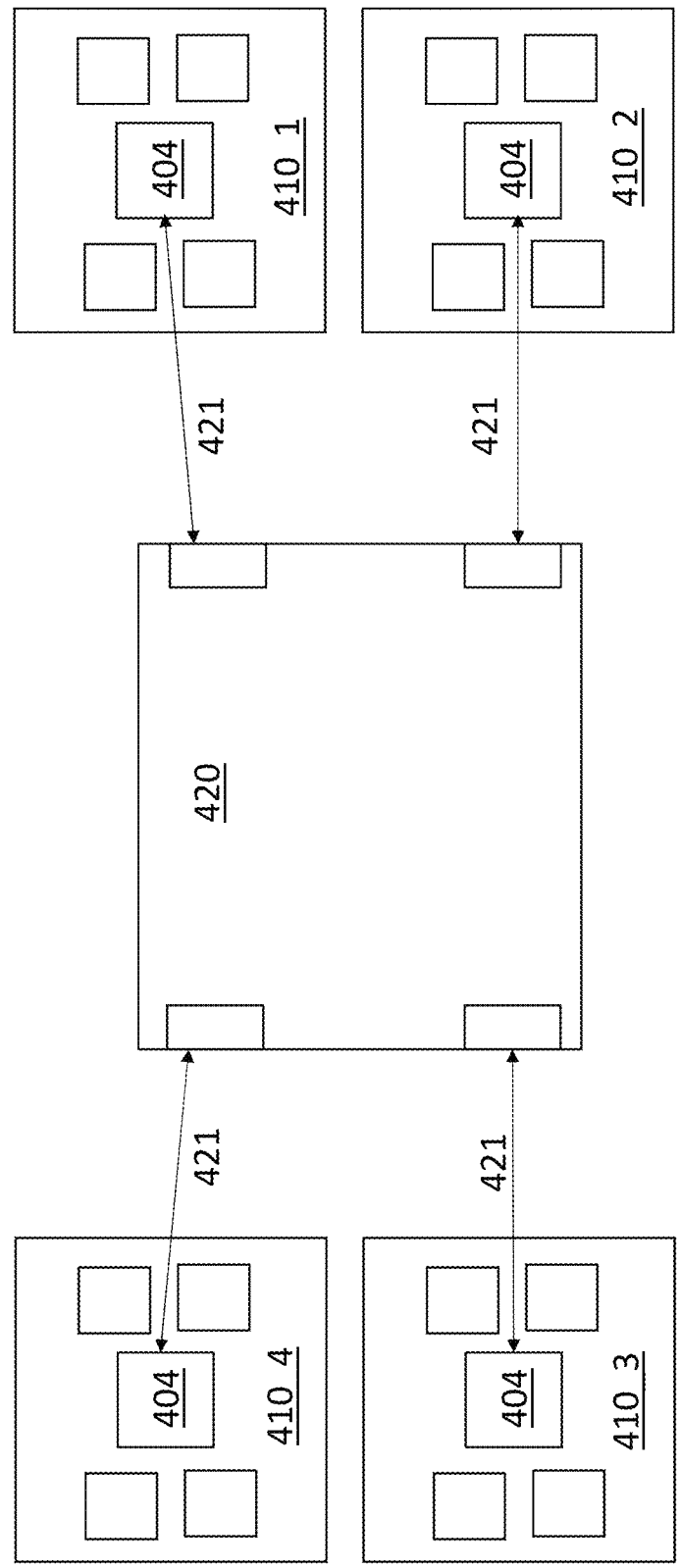
FIG. 4 shows a larger system implemented with the improved stacked memory solution of FIG. 3b.

FIG. 4 shows an example where a processor chip 420 is connected to four different instantiations 410_1 through 410_4 of the module/tile 310 of FIG. 3b. Here, the host chip 404 of each module/tile 410_1 through 410_4 corresponds to a buffer chip 404 that, e.g., provides some memory side caching for its module/tile (e.g., content of the module's/tile's most frequently requested addresses are kept on static random access memory (SRAM) or embedded dynamic random access memory (eDRAM) that is integrated within the host chip).

Additionally, the buffer chip 404 includes an instance of host side interface logic for each of the multiple stacked memory packages that reside on the module/tile 410 and routes requests from the processor chip 420 to the correct/targeted memory package via the correct interface on the buffer chip 404. In various embodiments, the communication link 421 between a buffer chip 404 and the processor chip 420 is an optical link. As such, there exists electrical to optical transmitters and optical to electrical receivers on both ends of the link 421.

It is pertinent to point out that the above teachings can be applied to any package of stacked memory chips and implementations that use the same. Stacked memory chip solutions, as is known in the art, commonly use through silicon vias (TSVs) to form communication channels through the stack. For example, the halves of the highest chip in a stack are coupled to respective TSVs that run through the lower remainder of the stack to the logic chip that the memory chip stack is mounted to.

Some or all of these stacked memory chip solutions may incorporate characteristics of other JEDEC HBM specifications (e.g., HBM2, HBM3, etc.). For example, such characteristics can include dividing each memory chip into quarters (rather than halves) and coupling a dedicated channel to that quarter. In an option 1 approach, channels that are coupled to different memory chip quarters are then coupled to a same multiplexer that is integrated on the underlying chip. During an access to any particular one of these quarters, the multiplexer selects the channel that is coupled to that quarter.

The number of multiplexers and/or number of unique internal channels per multiplexer and/or difference between external channel width and internal channel width can vary from embodiment to embodiment. For example, if the option 1 solution of FIG. 2a where expanded to embrace memory chips divided into quarters each having its own dedicated internal channel (and each internal channel coupled to only one quarter), the design of the logic chip could be designed to incorporate a pair of 1:8 multiplexers, or, four 1:4 multiplexers.

Note that the former (1:8) would keep the total number of channel wires between the host chip and memory package at 256b, whereas, the later approach (1:4) would double the wire count to 512b. At the same time, the former (1:8) would permit only two memory chip quarters to be accessed at any time, whereas, the later (1:4) would permit four memory chip quarters to be accessed at any time. Thus the former emphasizes minimizing I/O whereas the later scales back somewhat on I/O minimization in favor of placing some emphasis on bandwidth (the more channels that exist between the memory package and the host chip the greater the bandwidth between them). Any of these are options available to the designer.

In the case of approaches that adopt option 2, whereas traditional HBM solutions require 128b per internal channel, the designer can choose any of a number of possible internal channels widths that are much narrower than 128b. For example, a package having DRAM memory chips each having a capacity of 16 gigabits (Gb), 64 gigabits (Gb) or higher that are fractioned into quarters (or more) where each fraction is coupled to a channel having a width less than 64b (such as 32b).

Other characteristics can include even more chips in the memory chip stack. For example, some embodiments can include twelve memory chips in the stack (rather than just four or eight). Again, such memory chips can be divided into halves or quarters (or other fraction) each having its own dedicated channel. Each of the package's internal channels could be coupled to only one memory chip fraction, or, multiple memory chip fractions. The number of multiplexers in the logic chip, the multiplexing ratio of the multiplexers, and/or how many memory chip fractions are couple to a single internal channel can be determined by the designer to meet whatever I/O and/or bandwidth characteristics are appropriate for the designer's implementation.

Any of the teachings herein could also be adopted by an industry standard body (such as JEDEC) and promulgate one or more standards for a packaged memory chip solution that includes any/all of the teachings described herein.

Although stacked memory chip packages commonly contain only dynamic random access memory chips, the teachings herein can be applied not only to such stacked memory chip packages but also stacked memory chip packages that include non-volatile memory (such as byte addressable non-volatile memory described in more detail below) or a combination of non-volatile and volatile memory. Such stacked memory chip packages, even if they contain non-volatile memory chips, can be used as the main memory for a processor chip on the host side.

Figure 5:
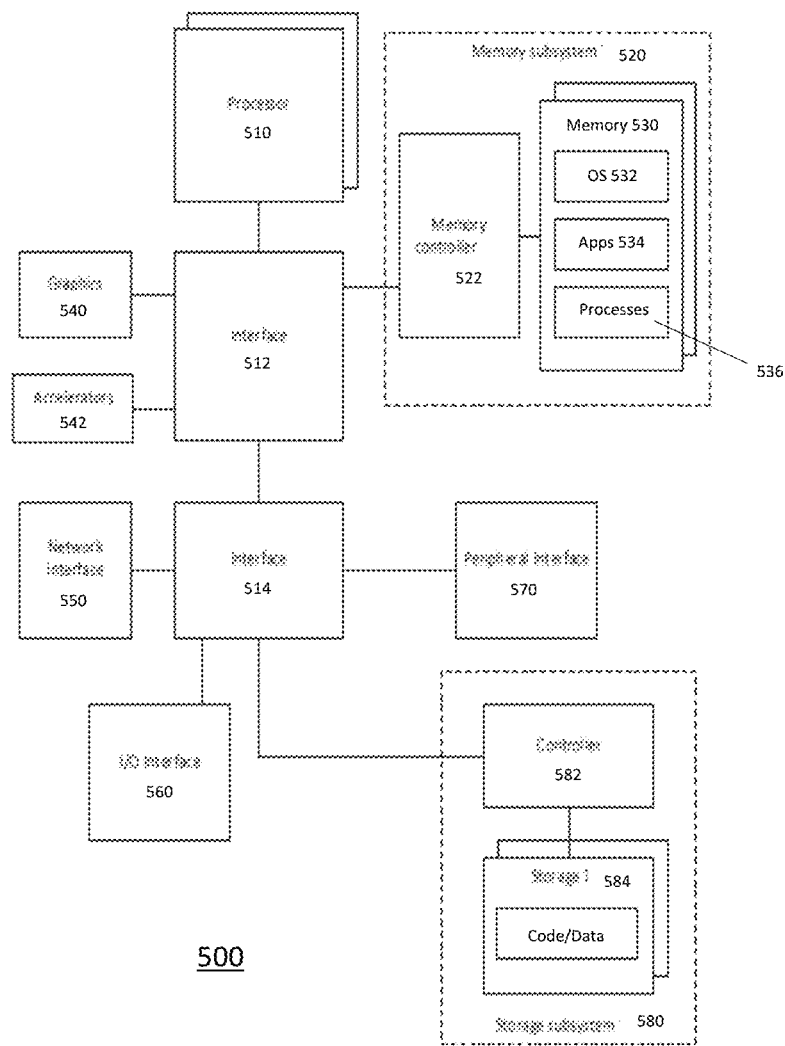
FIG. 5 shows a system.

FIG. 5 depicts an example system. The system can use the teachings provided herein. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU). For example, accelerators 542 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 542 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, volatile memory, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software logic to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications. The JEDEC standards are available at www.iedec.org.

The memory can be a stacked memory chip solution that implements any of the teachings described above.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 500 includes interface 514, which can be coupled to interface 512. In one example, interface 514 represents an interface circuit, which can include stand-alone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data in a persistent state (e.g., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (e.g., the value or state of the data is indeterminate if power is interrupted to system 500). In one example, storage subsystem 580 includes controller 582 to interface with storage 584. In one example controller 582 is a physical part of interface 514 or processor 510 or can include circuits or logic in both processor 510 and interface 514.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 500. More specifically, power source typically interfaces to one or multiple power supplies in system 500 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 6:
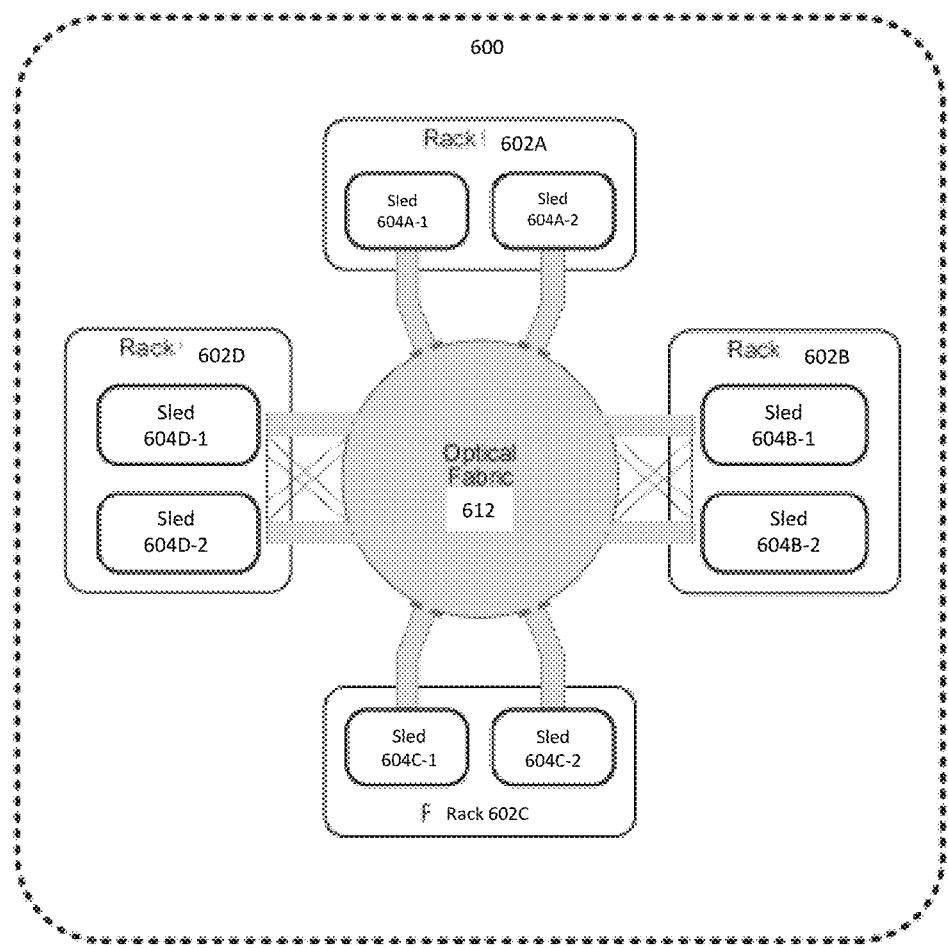
FIG. 6 shows a data center.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. However, optical, wireless, and/or electrical signals can be transmitted using fabric 612. The signaling connectivity that optical fabric 612 provides to any given sled may include connectivity both to other sleds in a same rack and sleds in other racks. Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

Figure 7:
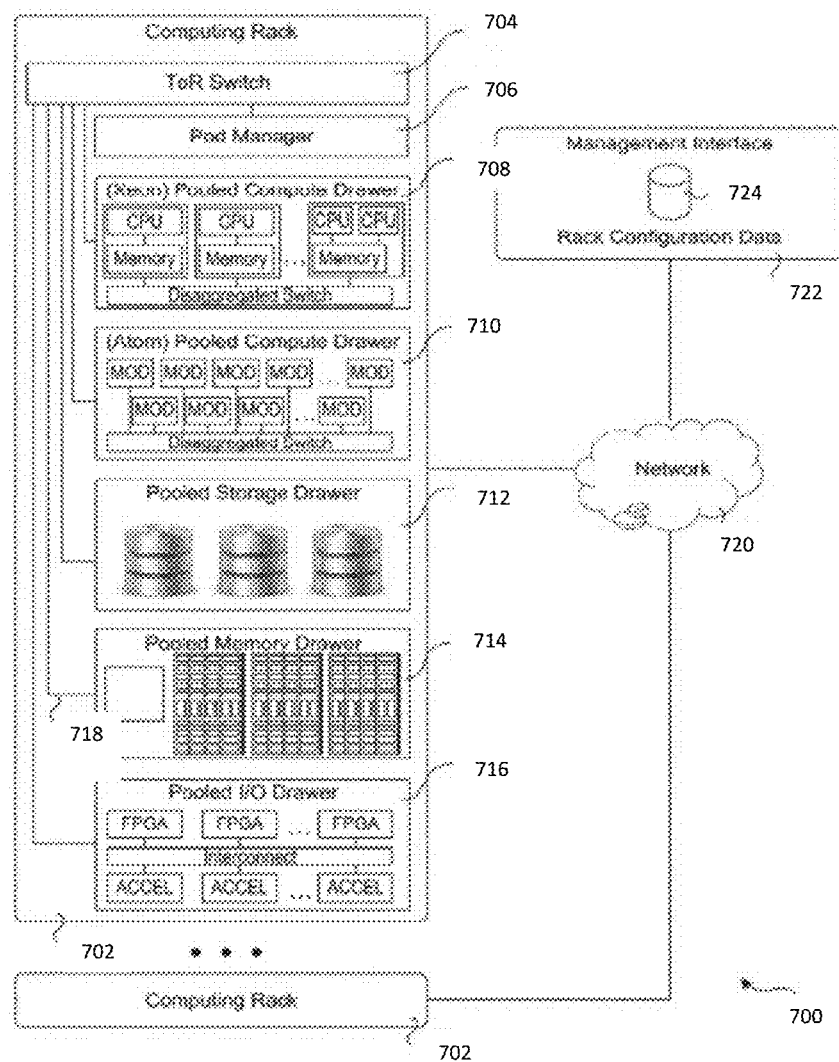
FIG. 7 shows a rack.

FIG. 7 depicts an environment 700 includes multiple computing racks 702, each including a Top of Rack (ToR) switch 704, a pod manager 706, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 708, and INTEL® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as a 40 Gigabit/second (Gb/s) or 100 Gb/s Ethernet link or an 100+Gb/s Silicon Photonics (SiPh) optical link. In one embodiment high-speed link 718 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 700 may be interconnected via their ToR switches 704 (e.g., to a pod-level switch or data center switch), as illustrated by connections to a network 720. In some embodiments, groups of computing racks 702 are managed as separate pods via pod manager(s) 706. In one embodiment, a single pod manager is used to manage all of the racks in the pod. Alternatively, distributed pod managers may be used for pod management operations.

RSD environment 700 further includes a management interface 722 that is used to manage various aspects of the RSD environment. This includes managing rack configuration, with corresponding parameters stored as rack configuration data 724.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
   a logic chip upon which a stack of memory chips is to be placed, the stack of memory chips and the logic chip to be placed within a same package, wherein multiple memory chips of the stack of memory chips are divided into fractions;
   multiple internal channels within the same package that emanate from the logic chip to be coupled to respective ones of the fractions; and
   the logic chip comprising:
   a multiplexer, the multiplexer to multiplex a single input/output (I/O) channel of the same package to the multiple internal channels, and
   a second multiplexer, the second multiplexer to multiplex other multiple internal channels within the same package coupled to other ones of the fractions to another single I/O channel of the same package.

2. The apparatus of claim 1 wherein the stack of memory chips is to comprise one of:
   4 memory chips total;
   8 memory chips total;
   12 memory chips total.

3. The apparatus of claim 1 wherein the fractions comprise one of:
   halves;
   quarters.

4. The apparatus of claim 1 wherein the multiplexer and second multiplexer each have a multiplexing ratio of one of:
   1:4;
   1:8.

5. The apparatus of claim 1 wherein the multiplexer has a multiplexing ratio of one of:
   1:4;
   1:8.

6. The apparatus of claim 1 wherein a particular one of the multiple internal channels is to be coupled to more than one of the fractions.

7. A computing system comprising:
   a package containing a stack of memory chips mounted on a logic chip, multiple memory chips of the stack of memory chips divided into fractions, multiple internal channels within the package coupled to respective ones of the fractions, the logic chip comprising:
   a multiplexer, the multiplexer to multiplex a single input/output (I/O) channel of the package to the multiple internal channels, the package mounted to a printed circuit board, and
   a second multiplexer, the second multiplexer to multiplex other internal respective channels of other multiples ones of the fractions to another single output channel of the package; and
   a host chip mounted to a printed circuit board, wherein, the single I/O channel of the package is coupled to the host chip through wiring formed within the printed circuit board and not with wiring formed in a semiconductor chip that is embedded within the printed circuit board.

8. The computing system of claim 7 wherein the stack of memory chips comprises one of:
   4 memory chips total;
   8 memory chips total;
   12 memory chips total.

9. The computing system of claim 7 wherein the fractions comprise one of:
   halves;
   quarters.

10. The computing system of claim 7 wherein the multiplexer and second multiplexer each have a multiplexing ratio of one of:
    1:4;
    1:8.

11. The computing system of claim 7 wherein the multiplexer has a multiplexing ratio of one of:
    1:4;
    1:8.

12. The computing system of claim 7 wherein a particular one of the multiple internal channels is coupled to more than one of the fractions.

13. The computing system of claim 7 wherein the host chip is a processor chip.

14. A memory module tile, comprising:
    a) a package containing a stack of memory chips mounted on a logic chip, multiple memory chips of the stack of memory chips divided into fractions, multiple internal channels within the package coupled to respective ones of the fractions, the logic chip comprising a multiplexer, the multiplexer to multiplex a single input/output (I/O) channel of the package to the multiple internal channels, the package mounted to a printed circuit board; and,
    b) a buffer chip mounted to a printed circuit board, wherein, the single I/O channel of the package is coupled to the buffer chip through wiring formed within the printed circuit board and not with wiring formed in a semiconductor chip that is embedded within the printed circuit board;
    c) a link transmitter/receiver, the link transmitter/receiver to couple to a link that is coupled to a processor on an opposite end of the link.

15. The memory module tile of claim 14 wherein the link transmitter/receiver is an opto-electronic transmitter/receiver.

16. The memory module tile of claim 14 wherein the stack of memory chips comprises one of:
    4 memory chips total;
    8 memory chips total;
    12 memory chips total.

17. The memory module tile of claim 14 wherein the fractions comprise one of:
   halves;
   quarters.

18. The memory module tile of claim 14 wherein the logic chip comprises a second multiplexer, the second multiplexer to multiplex other internal respective channels of other multiples ones of the fractions to another single output channel of the package.

19. An apparatus, comprising:
   a stack of memory chips upon a logic chip, the stack of memory chips and the logic chip within a package, multiple memory chips of the stack of memory chips divided into fractions of at least quarters, multiple internal channels within the package coupled to respective ones of the fractions, wherein a width of a respective one of the multiple internal channels is less than 64b and each of the multiple memory chips have a respective capacity of at least 16 Gb; and
   the logic chip comprising:
   a multiplexer, the multiplexer to multiplex a single input/output (I/O) channel of the package to the multiple internal channels, and
   a second multiplexer, the second multiplexer to multiplex other multiple internal channels within the package coupled to other ones of the fractions to another single I/O channel of the package.

* * * * *